United States Patent [19]
Harada

[11] Patent Number: 5,192,713
[45] Date of Patent: Mar. 9, 1993

[54] METHOD OF MANUFACTURING SEMICONDUCTOR DEVICES HAVING MULTI-LAYERED STRUCTURE

[75] Inventor: Yusuke Harada, Tokyo, Japan

[73] Assignee: Oki Electric Industry Co., Ltd., Tokyo, Japan

[21] Appl. No.: 658,239

[22] Filed: Feb. 20, 1991

[30] Foreign Application Priority Data

Feb. 27, 1990 [JP] Japan .................................. 2-44628

[51] Int. Cl.⁵ ...................... H01L 21/44; H01L 21/48
[52] U.S. Cl. .................................. 437/192; 437/173; 437/200
[58] Field of Search ............... 437/192, 193, 200, 978, 437/196

[56] References Cited

U.S. PATENT DOCUMENTS

| | | | |
|---|---|---|---|
| 4,648,175 | 3/1987 | Metz, Jr. et al. | 437/192 |
| 4,764,484 | 8/1988 | Mo | 437/192 |
| 4,933,297 | 6/1990 | Lu | 437/193 |
| 4,987,099 | 1/1991 | Flanner | 437/192 |
| 5,006,484 | 4/1991 | Harada | 437/192 |
| 5,049,514 | 9/1991 | Mori | 437/941 |
| 5,108,941 | 4/1992 | Paterson et al. | 437/192 |

FOREIGN PATENT DOCUMENTS

| | | | |
|---|---|---|---|
| 63-244858 | 10/1988 | Japan | 437/228 |
| 2-084731 | 3/1990 | Japan | 437/228 |

Primary Examiner—Olik Chaudhuri
Assistant Examiner—Loc Q. Trinh
Attorney, Agent, or Firm—Spencer, Frank & Schneider

[57] ABSTRACT

A method of manufacturing a semiconductor device comprises the steps of preparing a semiconductor substrate, forming a field oxide layer for isolation between active areas, forming a diffusion layer in a surface of the semiconductor substrate, depositing a first insulating interlayer on the semiconductor substrate, forming a W-polycide layer including As on the first insulating interlayer selectively, depositing a second insulating interlayer on the first insulating interlayer and on the W-polycide layer, forming a first contact hole with a shallow depth on the W-polycide layer and a second contact hole with a deep depth on the diffusion layer, depositing a W layer in only the second contact hole by selective CVD so as not to form a step with the second insulating interlayer and, contacting the W-layer and the polycide layer by forming a wiring layer on the surface of the second insulating layer.

14 Claims, 5 Drawing Sheets

METHOD OF MANUFACTURING SEMICONDUCTOR DEVICES HAVING MULTI-LAYERED STRUCTURE

REFERENCE TO RELATED APPLICATION

This application claims the right of priority under 35 U.S.C. 119 of Japanese Application Ser. No. 44628 / 90, filed on Feb. 27, 1990, the entire disclosure of which is incorporated herein by reference.

BACKGROUND OF THE INVENTION

1. Field of the Invention

This invention relates to a method of manufacturing semiconductor devices having a multi-layered structure in which an upper layer connects to a lower layer through a contact hole, and more particularly to a method of forming a metalized pattern without breakage.

2. Description of the Related Art

A wiring structure of the semiconductor device is shown in FIG. 3.

In FIG. 3, a field oxide layer 2 for providing isolation between active areas is formed on a semiconductor substrate 1. A diffusion layer 3 is formed by doping phosphorus (P) into an active area of a surface of the substrate 1. Next an insulating layer (e.g., BPSG) 4 is formed on the semiconductor substrate 1 using a chemical vapor deposition (CVD) process. The insulating layer 4 then is etched selectively to form a contact hole 5 until a surface of the diffused region 3 in the semiconductor substrate 1 is exposed. An Al-Si series metal layer 6 is then formed over the entire area of the surface of the semiconductor substrate using a sputtering process. The metal layer 6 is etched selectively to form the desired wiring pattern or structure.

The wiring structure of the conventional device is completed by the steps mentioned above. As can be seen in FIG. 3, with this process the metal layer 6 does not completely fill the content hole 5 so that the outer surface of the portion of metal layer 6 actually contacting the region 3 forms a step with the outer surface of the remainder of the layer 6.

However, the diameter of the contact hole becomes smaller in proportion to increasing an integration of the devices. Therefore, the aspect ratio of the depth of the diameter of the contact hole 5 becomes larger.

In such a device, which is formed by the manufacturing process shown in FIG. 3, it is difficult to form the metalizing wiring pattern without breakage in the contact hole 5 because of the deterioration of the step-coverage of the metal layer.

In order to overcome such a problem, a technique has been developed, which fills the contact hole with metal material before the metal layer is formed over the semiconductor substrate.

A typical example of this teaching utilizes a selective tungsten (W)-CVD process and is explained with reference to FIG (4). In FIG. 4, a field oxide layer 12 for isolation between active areas and a diffusion layer 13 are formed on the surface of the semiconductor substrate 11. Then an insulating layer 14 with a contact hole 15 over the diffusion layer 12 is formed on the semiconductor substrate 11. Next only the contact hole 15 is completely filled with a tungsten layer 16 by the selective W-CVD process. Consequently, the W layer surface is at the same surface as the insulating layer 14 and does not form a step with the insulating layer 14.

Then, an aluminum-silicon (Al-Si) series metal layer 17 is formed over the whole surface of the substrate 11 by using a sputtering process. The metal layer 17 subsequently is etched selectively to form a predetermined metalized pattern.

According to this method, the above problem can be solved.

However, in an actual device having the multi-layered structure shown in FIG. 5, it is required to form contact holes with different depths for the diffusion layer 23 and for the first electrode 25. In this case, if the selective CVD process is utilized for this device, W layers 28 and 29 are formed simultaneously in the contact hole 26 on the diffusion layer 23 and in the contact hole 27 on the first electrode 25 as a lower conductive layer by the W-CVD process. Therefore, the thickness (m) of the W layers 28 and 29 must be equal to or thinner than the thickness (1) of the insulating layer 24 on the first electrode 25. This is because if a W layer 28 in the contact hole 26 having a thickness which is equal to the thickness (n) of the insulating layer 24 on the substrate 21 is formed, the W layer 29 runs over the contact hole 27. As a result, it is possible that the W layer 29 shorts with another W layer formed in another contact hole (not shown in the drawings) which has the same depth as contact hole 26.

Therefore, the contact hole 26 is not completely filled by the W layer because the thickness of the W layer 28 is equal to that of the W layer 29 and the depth of the contact hole 26 is deeper than that of the contact hole 27. As the result, it is quite possible that the second electrode layer 30, i.e., the conductive layer, breaks in the contact hole 26 because of the deterioration of the step-coverage.

As the reason of the above mentioned, it is not satisfied technically that the selective W-CVD process is adapted to the manufacturing of the device which has contact holes with different depths.

Accordingly, an object of this invention is to provide a method of manufacturing semiconductor devices which can solve the above mentioned problem.

BRIEF SUMMARY OF THE INVENTION

According to the invention, a method of manufacturing semiconductor devices comprises the steps of:
(a) preparing a semiconductor substrate;
(b) forming a field oxide layer for isolation between active areas;
(c) forming a diffusion layer in a surface of the semiconductor substrate;
(d) depositing a first insulating interlayer on the semiconductor substrate;
(e) forming a W-polycide layer including As on a selected portion of the first insulating interlayer;
(f) depositing a second insulating interlayer on the first insulating interlayer and the W-polycide layer;
(g) forming a first contact hole with a shallow depth on the W-polycide layer and a second contact hole with a deep depth on the diffusion layer;
(h) depositing a W layer in only the second contact hole by selective CVD to sufficiently fill the second contact hole so as not to form a step with the second insulating interlayer and;
(i) forming a wiring layer to contact the W layer and the polycide layer.

According to the invention, if the selective W-CVD process is applied to a device having two contact holes which have different depth, the W layer is formed in the deep contact hole only, and is not formed in the shallow one.

Therefore, according to this invention, the second electrode as an upper conductive layer does not break in the contact hole.

BRIEF DESCRIPTION OF THE DRAWINGS

These and other features and advantages of the invention will be further understood from the following detailed description of the preferred embodiment, with reference to the accompanying drawings in which:

FIG. 2 (b) is a view sketching the microphotograph shown in FIG. 2 (a).

DETAILED DESCRIPTION OF THE PREFERRED EMBODIMENT

Figure 1A:
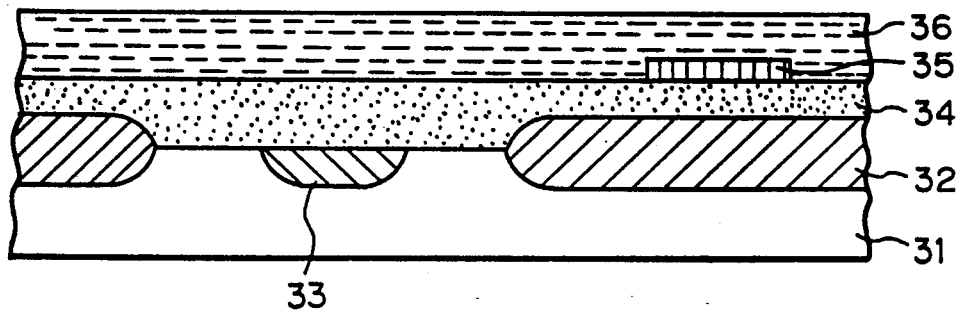
FIGS. 1 (a) through 1 (c) are cross sectional views illustrating a manufacturing method of an embodiment of the present invention.
Figure 1B:
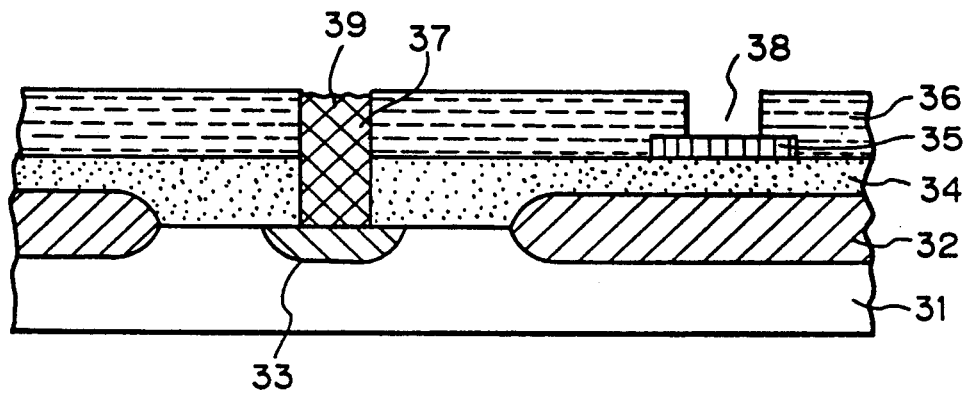
Figure 1C:
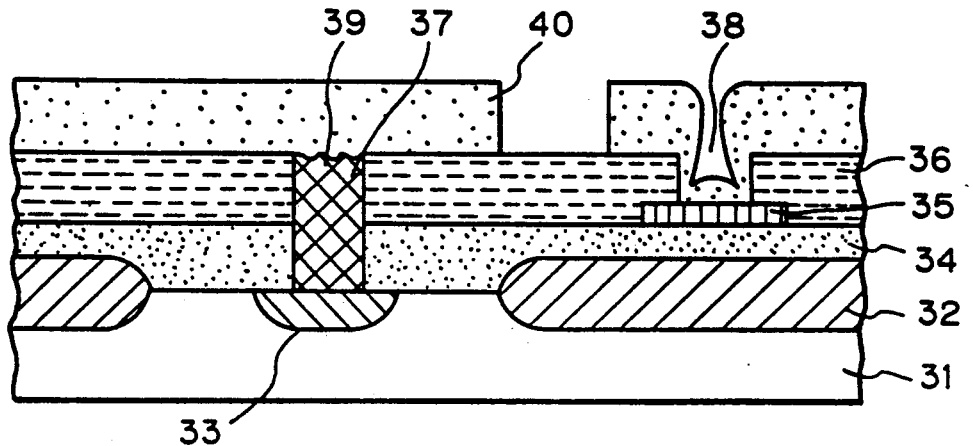

Referring to the drawings, a method of manufacturing semiconductor devices according to the present invention is explained with reference to FIG. 1(a) to FIG. 1(c).

Each of the measurements, shapes and arrangements of the preferred embodiment described herein are illustrative and not restrictive, the scope of the invention being indicated by the appended claims. All versions which come within the meaning of the claims are intended to be included therein.

The following refers to the drawings, wherein like reference numerals designated like or corresponding parts throughout the several views.

FIGS. 1 (a)-1 (c) are cross sectional views illustrating an embodiment of a manufacturing method of the present invention.

In FIG. 1 (a), a silicon substrate 31 is prepared. A field oxide 32 is then formed on the silicon substrate 31 to isolate individual MISFETs by selective oxidation. A diffusion layer 33 (the first lower contact layer) is then formed by doping with P as an impurity in an active area on the surface of the semiconductor substrate 31. The first insulating interlayer 34 (e.g., BPSG) is deposited, using a CVD process, to a thickness of 5000 Å on the substrate 31 and then annealed at 950° C. in an $N_2$ atmosphere for 15 minutes to provide an even surface. A polysilicon layer is then formed by the CVD process to a thickness of 1000-1500 Å on the even surface of the first insulating interlayer 34. Then the poly-silicon layer is doped with arsenic (As) impurity, acting as a dopant, by an ion implantation process wherein As is $1 \times 10^{16}$ ions / $cm^2$ and the energy is 40 keV. Then a tungsten-silicide (W-$Si_x$ layer is formed by a sputtering process to a thickness of about 1500 Å on the poly-silicon layer. Both the poly-silicon layer and the W-$Si_x$ layer are patterned by a photolithography etching process to form a predetermined pattern of metalization. Then, the second insulating interlayer 36 (e.g., BPSG) is deposited by the CVD process to a thickness of 5000 Å on the first insulating interlayer 34 and on the predetermined pattern., It is then annealed at 950° C. in an $N_2$ atmosphere for 15 minutes to provide an even surface. By this annealing, the predetermined pattern of the poly-silicon layer and the W-$Si_x$ layers are made into a W-polycide layer 35 of a high melting point metal including As, which serves as the second lower contact layer.

As shown in FIG. 1 (b), then contact holes 37 and 38 through the layers 36 and 34 over the diffusion layer 33 and through the layer 36 over the W-polycide layer 35 respectively a RIE (reactive ion etching) process wherein the pressure is 80 pa, RF power is 400 W, the $C_2F_6$ gas flow rate is 15 sccm, and the $CHF_3$ gas flow rate is 20 sccm.

A W layer 39 then is formed by a selective CVD process in the deep contact hole 37 on the diffusion layer 33 until the W layer 39 completely fills the hole 37, i.e., the layer 39 does not form a step with the second insulating interlayer 36. During this time, no W layer forms in the shallow contact hole 38 on the W-polycide layer 35 because the W-polycide layer 35 includes As.

Thereafter as shown in FIG. 1 (c), an Al-Si series metal layer 40 is formed by a sputtering process to a thickness of about 6000 Å over the whole surface of the substrate. Then the Al-Si metal layer 40 is etched selectively to form second electrode 40 as an upper conductive layer. The semiconductor device having multi-layered structure according to the present invention is completed by the mentioned processes. Although the mentioned processes constitute the preferable embodiment, the present invention is not restricted to the processes mentioned above. For example, after the contact holes 37 and 38 are formed, an As impurity may be doped by the ion implantation process in only the shallow contact hole 38. When the concentration of As in the polycide layer 35 is higher than the concentration of P in the diffusion layer 33, the W layer is not deposited on the polycide layer 35 including As.

Figure 2A:
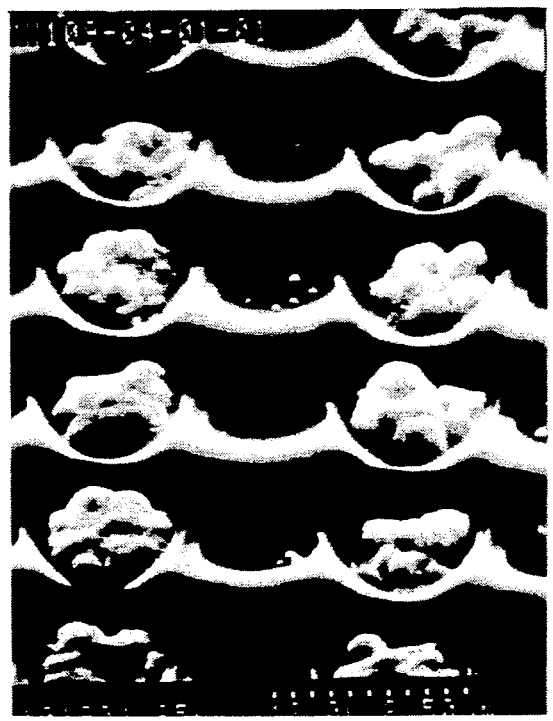
FIG. 2 (a) is a microphotograph which shows W layers formed by a selective CVD process of the invention.
Figure 2B:
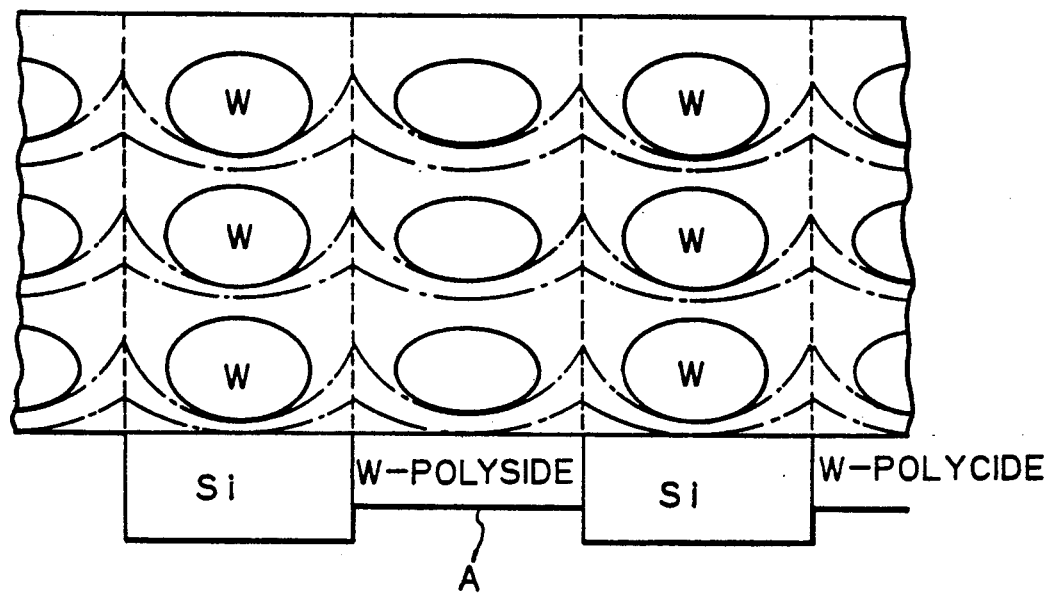
Figure 3:
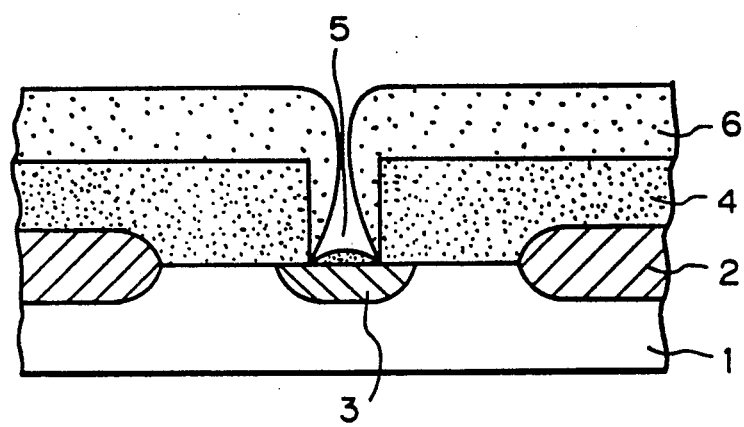
FIG. 3 through FIG. 5 are sectional views of conventional devices formed by different processes respectively.
Figure 4:
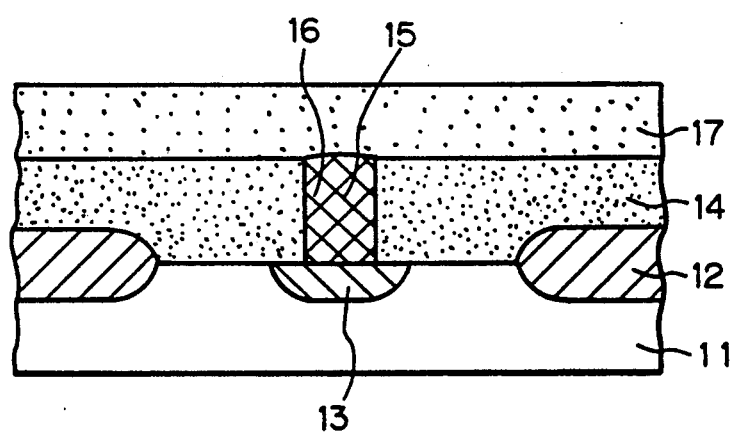
Figure 5:
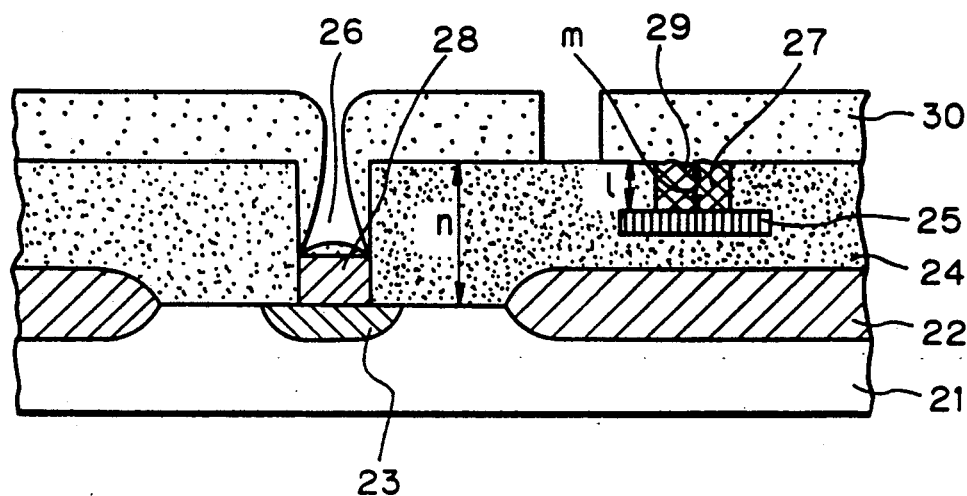

FIG. 2 (a) is a microphotograph which shows W layers formed on the diffusion layer, but not on the polycide layer, by the selective CVD of W process of this invention. FIG. 2 (b) is a view sketching the microphotograph shown in FIG. 2 (a).

As shown clearly in FIG. 2 (a) and (b), the W layer is not deposited on areas (A) of the W-polycide layer.

If a P doped W-polycide layer is formed, when a W layer is formed in the deep contact hole 37 by the selective CVD process, the W layer is formed selectively in the shallow contact hole 38 simultaneously. On the other hand, if an As doped W polycide according to this invention is formed, when a W layer is formed in the deep contact hole 37 by the selective CVD process, a W layer is not formed selectively in the shallow contact hole 38.

The reason of this phenomenon is considered that the condition of the surface of the As doped W-polycide layer is different from the condition of the surface of the P doped W-polycide layer. However, the details are not yet known.

According to this invention, because As is doped in the W-polycide layer, if the selective CVD process is applied to the semiconductor device having contact holes with different depths, a W layer is not formed in contact holes on the As doped polycide layer, and is formed in the other contact holes selectively.

Therefore, according to the invention, the problem of the deterioration of step-coverage of the Al-Si series metal layer, i.e., the upper content layer, can be solved since a W layer can be formed and completely fill the contact hole selectively.

Moreover, the step-coverage of the Al-Si series metal layer in the shallow contact hole has no complications because the depth of the shallow contact hole is equal to the depth of only one insulating interlayer.

Therefore, according to this invention, it is possible to manufacture a semiconductor device without short circuits or breakage in a contact hole.

What is claimed is:

1. A method of manufacturing a semiconductor device, comprising the steps of:
   (a) preparing a semiconductor substrate;
   (b) forming a field oxide layer on a surface of the substrate for isolation between active areas;
   (c) forming a diffusion layer in an active area of the surface of the semiconductor substrate;
   (d) depositing a first insulating interlayer on the surface of the semiconductor substrate;
   (e) forming a W-polycide layer including As on a selected portion of the first insulating interlayer;
   (f) depositing a second insulating interlayer on the first insulating interlayer and on the W-polycide layer;
   (g) forming a first contact hole with a shallow depth on the W-polycide layer and a second contact hole with a deep depth on the diffusion layer;
   (h) depositing a W layer in only the second contact hole by selective CVD to fill the second contact hole so as not to form a step with the second insulating interlayer; and,
   (i) forming a wiring layer on the surface of the second insulating layer to contact the W layer in the second contact hole and the W-polycide layer via the first contact hole.

2. The method according to claim 1 wherein said step of forming a diffusion layer includes diffusing phosphorus into said active area.

3. The method according to claim 2 wherein said step of forming a W-polycide layer including As includes forming the W-polycide layer including As with a concentration greater than the concentration of phosphorous in the diffusion layer.

4. The method according to claim 3 wherein said step of forming a W-polycide layer including As includes ion implanting As ions with a dose of $1 \times 10^{16}$ ions/cm$^2$ and an energy of 40 keV.

5. A method of manufacturing a semiconductor device, comprising the steps of in that order:
   (a) preparing a semiconductor substrate;
   (b) forming a field oxide layer on a surface of the substrate to provide isolation between active areas;
   (c) forming of diffusion layer in an active area of the surface of the semiconductor substrate;
   (d) depositing a first insulating interlayer on the surface of the semiconductor substrate;
   (e) forming a W-polycide layer including As on a selected portion of the first insulating interlayer;
   (f) depositing a second insulating interlayer on the first insulating interlayer and on the W-polycide layer;
   (g) forming a first contact hole with a shallow depth on the W-polycide layer and a second contact hole with a deep depth on the diffusion layer;
   (h) depositing a W layer in only the second contact hole by selective CVD to fill the second contact hole so as not to form a step with the second insulating interlayer; and,
   (i) forming a wiring layer on the second insulating interlayer to contact said W-layer in the deep said second contact hole and said W-polycide layer via the shallow first contact hole.

6. The method according to claim 5 wherein said step of forming a diffusion layer includes diffusing phosphorus into said active area.

7. The method according to claim 6 wherein said step of forming a W-polycide layer including As includes forming the W-polycide layer including As with a concentration greater than the concentration of phosphorous in the diffusion layer.

8. The method according to claim 7 wherein said step of forming a W-polycide layer including As includes ion implanting As ions with a dose of $1 \times 10^{16}$ ions/cm$^2$ and an energy of 40 keV.

9. A method of manufacturing a semiconductor device, comprising the steps of in that order:
   (a) preparing a semiconductor substrate;
   (b) forming a field oxide layer on a surface of the substrate to provide isolation between active areas;
   (c) forming a diffusion layer in an active area of the surface of the semiconductor substrate;
   (d) depositing a first insulating interlayer on the semiconductor substrate surface;
   (e) forming a W-polycide layer on a selected portion of the first insulating interlayer;
   (f) depositing a second insulating interlayer on the first insulating interlayer and on the W-polycide layer;
   (g) forming a first contact hole with a shallow depth on the W-polycide layer and a second contact hole with a deep depth on the diffusion layer;
   (h) doping As in only the W-polycide layer through the shallow first contact hole;
   (i) depositing a W layer in only the second contact hole by selective CVD to fill the second contact hole so as not to form a step with the second insulating interlayer; and,
   (j) forming a wiring layer on the second insulating interlayer to contact the W-polycide layer via the shallow first contact hole and the W-layer via the deep second contact hole.

10. The method according to claim 9 wherein said step of forming a diffusion layer includes diffusing phosphorus into said active area.

11. A method according to claim 10 wherein said step of doping As includes doping the W-polycide layer through the shallow contact hole to an As concentration greater than the concentration of the phosphorous in the diffusion layer.

12. The method according to claim 11 wherein said step of doping As comprises doping with an ion implantation process with a dose of As of $1 \times 10^{16}$ ions/cm$^2$ and an energy of 40 keV.

13. A method of manufacturing a semiconductor device comprising the steps of:
   (a) preparing a silicon semiconductor substrate;
   (b) providing a region doped with phosphorous at at least one selected portion of the substrate surface;
   (c) depositing a first insulating layer on the surface of the substrate;
   (d) forming a polycrystalline silicon layer doped with arsenic to a concentration greater than the concentration of phosphorus in said region, and an overlying thin layer of tungsten silicide on a selected portion of an outer surface of said first insulating layer;
   (e) depositing a second insulating layer on the first insulating layer and on the tungsten silicide layer;

(f) annealing the substrate to convert the arsenic doped polycrystalline silicon layer and the tungsten silicide layer to a tungsten polycide layer doped with arsenic;

(g) forming a shallow contact hole through said second insulating layer to expose a portion of the surface of said tungsten polycide layer, and a deep contact hole through said first and second insulating layers to expose a portion of the surface of said region doped with phosphorus.

(h) depositing tungsten in only said deep contact hole by selective CVD to contact said region and fill said deep contact hole; and, (i) forming a wiring layer on the second insulating layer to contact the tungsten in the deep contact hole and the tungsten polycide layer via the shallow contact hole.

14. The method according to claim 13 wherein said step (d) includes depositing a polycrystalline silicon layer on the surface of the first insulating layer and implanting arsenic ions of a dose of $1 \times 10^{16}$ ions/cm$^2$ at an energy of 40 keV in the polycrystalline silicon layer.

* * * * *